United States Patent
Herrmann et al.

[11] Patent Number: 5,859,386
[45] Date of Patent: Jan. 12, 1999

[54] SUPERCONDUCTIVE ELECTRICAL TRANSMISSION LINE

[75] Inventors: Peter Friedrich Herrmann, Corbreuse-Dourdan; Pierre Mirebeau, Villebon; Thierry Verhaege, Saulx-les-Chartreux, all of France

[73] Assignee: Alcatel Alsthom Compagnie Generale d'Electricite, Paris, France

[21] Appl. No.: 841,567

[22] Filed: Apr. 30, 1997

Related U.S. Application Data

[63] Continuation of Ser. No. 510,672, Aug. 3, 1995, abandoned.

[30] Foreign Application Priority Data

Aug. 4, 1994 [FR] France ................................ 94 09708

[51] Int. Cl.$^6$ ................................................... H01B 12/00
[52] U.S. Cl. ...................... 174/15.5; 174/15.4; 307/147; 505/856; 505/885
[58] Field of Search ................................ 174/15.4, 15.5, 174/15.6, 125.1; 505/220, 230, 232, 704, 856, 866, 884, 885, 886, 887, 925; 307/147

[56] References Cited

U.S. PATENT DOCUMENTS

| | | | |
|---|---|---|---|
| 3,133,145 | 5/1964 | Bahn | 174/15.6 |
| 4,072,815 | 2/1978 | Hildebramt | 174/15.5 |
| 4,485,266 | 11/1984 | Minati et al. | 174/15.4 |
| 4,992,623 | 2/1991 | Brieley et al. | 174/15.4 |

FOREIGN PATENT DOCUMENTS

| | | |
|---|---|---|
| 0520374A1 | 12/1992 | European Pat. Off. . |
| 2535487 | 2/1977 | German Dem. Rep. . |
| 4208378A1 | 9/1993 | Germany . |

OTHER PUBLICATIONS

Hawley, The condensed Chemical Dictionary, $8_{th}$ Editon 1971, p. 350.

*Primary Examiner*—Hyung-Sub Sough
*Attorney, Agent, or Firm*—Sughrue, Mion, Zinn, Macpeak & Seas, PLLC

[57] ABSTRACT

An electrical transmission line for conveying and limiting current by using a plurality of tubular portions made from a superconductive material. The tubular portions have a high critical temperature and are connected end-to-end by flexible, electrically conductive metal or alloy joints. A cryogenic fluid flows inside a first tube within the tubular portions. A vacuum is maintained inside a second tube around the tubular portions.

19 Claims, 2 Drawing Sheets

SUPERCONDUCTIVE ELECTRICAL TRANSMISSION LINE

This is a continuation of application Ser. No. 08/510,672 filed Aug. 3, 1995 now abandoned.

BACKGROUND OF THE INVENTION

1. Field of the Invention

The present invention concerns a superconductive electrical transmission line with two functions: transportation of current and current limitation.

2. Description of the Prior Art

The invention finds one specific but non-limiting application in an electric power production plant comprising a medium-voltage (for example 20 kV) generator connected by a transmission line a few hundreds of meters long to a medium-voltage/high-voltage (for example 20 kV/400 kV) transformer station. The transmission line carries a very high current (for example on the order of 20 kA); large cross-section (500 mm diameter) conductors are usually employed, cooled by a fluid (usually air) flowing in a large-diameter (typically one meter) metal pipe. The losses in a transmission line of this kind are on the order of 3000 kW/km/GW.

Consideration has been given to using superconductors with a low critical temperature for these transmission lines since they can transport very high current densities with very low losses. This type of transmission line requires a substantial and complex cryogenic plant because of the need to maintain the low temperature, which is close to the temperature of liquid helium (4.2°K). Substantial and therefore costly insulation is also required to limit cryogenic losses to an acceptable level. For this reason there are no such transmission lines in use at this time.

The introduction of superconductive ceramics with a high critical temperature, for example a temperature above that of liquid nitrogen, indicates the possibility of implementations that are favorable from both the economic and technical points of view.

The use of superconductors to limit short-circuit currents has also been investigated. This application exploits the property of the superconductive material of switching from a superconductive state with virtually zero resistance to a so-called normal state with a very high resistance beyond a critical value of the current. In this way it is possible to limit the value of a short-circuit current to a particular value, for example five times the nominal current, where without such limitation it could increase to at least 20 times the nominal current, for example. This limitation prevents the damage that can otherwise be done by the short-circuit current and enables a substantial saving in terms of the rating of the lines, the generators, the transformers and the switching plant.

A current limiter is usually regarded as an additional device to be connected in series into the line to be protected.

One object of the present invention is to provide a superconductive transmission line with two functions: transportation of current and current limitation, and which contributes the advantages and performance of each function.

SUMMARY OF THE INVENTION

The invention consists in an electrical transmission line for conveying and limiting current comprising a plurality of tubular portions made from a superconductive material having a high critical temperature connected end-to-end by flexible good electrical conductor metal or alloy joints, a first tube inside said tubular portions in which a cryogenic fluid flows and a second tube around said tubular portions in which a vacuum is maintained.

Other features and advantages of the invention will emerge from a reading of the following description of one embodiment of the invention given with reference to the appended drawings.

DETAILED DESCRIPTION OF THE PREFERRED EMBODIMENT

Figure 1:
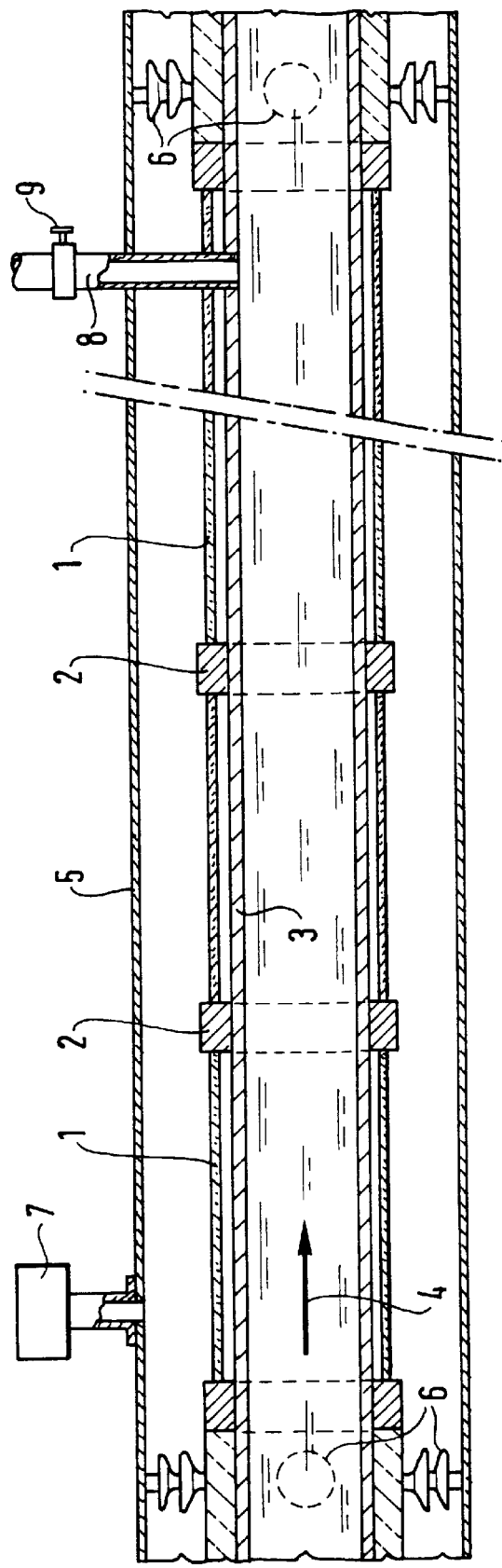
FIG. 1 is an axial view of one phase of the inventive transmission line.

FIG. 1 is a diagrammatic view of one phase of a transmission line of the invention; a three-phase transmission line comprises three identical single-phase transmission lines arranged in a flat bundle or in a trihedron.

The single-phase transmission line of FIG. 1 comprises a plurality of tubular portions 1 made from a superconductive material with a high critical temperature, for example from the ceramic with formula $Bi_2Sr_2COCu_2O_8$; the portions have a length of about ten meters, for example.

The portions are disposed end-to-end and joined in pairs by a flexible metallic joint 2 preferably made from copper or an alloy having a high electrical conductivity. The flexibility of the joints enables the transmission line to assume a curved shape, if necessary.

The tubular superconductor portions are cooled by a cryogenic fluid flowing in a tube 3 disposed inside the tubular portions 1; the fluid flow is symbolically represented in FIG. 1 by the arrow 4; the cryogenic fluid is liquid nitrogen at atmospheric pressure, the temperature of which is between 65 K and 77 K.

Electrical insulation is provided by a vacuum inside the metal (for example steel) tube 5 surrounding all the tubular superconductor portions 1. The tube is supported at the ends by insulators 6; intermediate insulators (not shown) can be provided.

The vacuum is maintained by a pump set 7.

From place to place the inside of the tube 3 communicates with the outside via pipes 8 incorporating a one-way valve 9 to evacuate nitrogen gas resulting from evaporation of the liquid nitrogen on transition of the superconductor portions to the normal state, for example in the event of a short-circuit.

Figure 2:
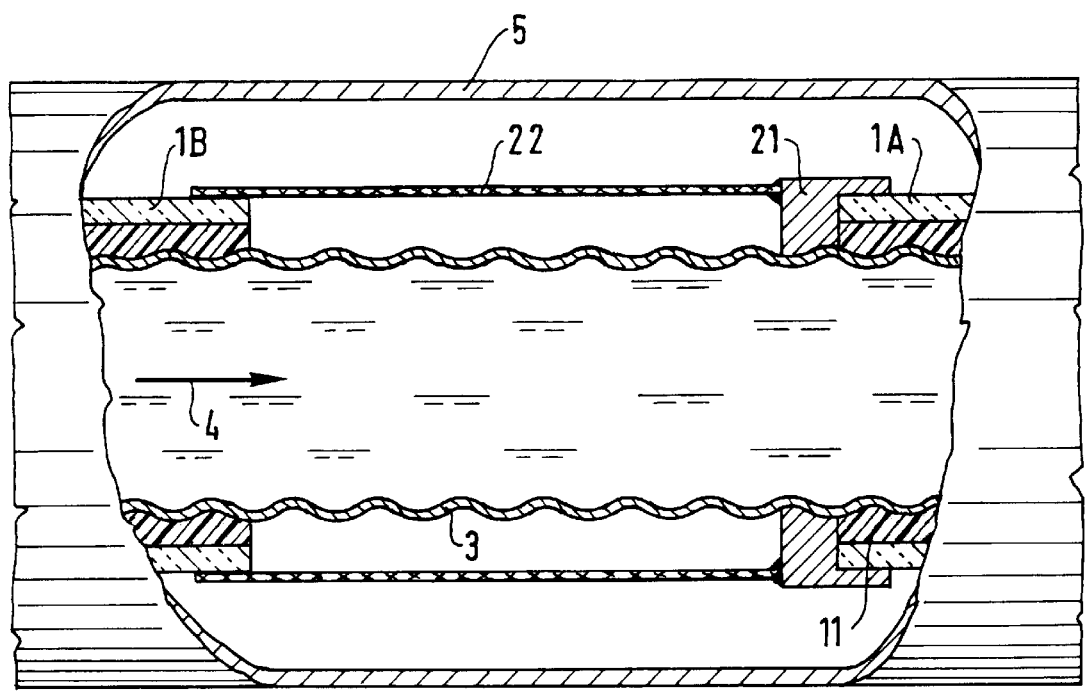
FIG. 2 is a larger-scaled view showing one embodiment of a joint between two tubular superconductor portions.

FIG. 2 shows part of FIG. 1 to a larger scale, showing in particular the joint between two superconductor portions.

A joint typically comprises a copper ring 21 welded to one of the superconductor portions to be joined, the port 1A in FIG. 2, and to a first end of a metal braid 22 the second end of which rests on the second superconductor portion to be joined. The flexibility of the braid 22 confers upon the joint the flexibility required to enable curvature of the transmission line. The braid also compensates for differential thermal expansion occurring, for example, when the transmission line is first cooled down, by sliding at the ends of the tubular superconductor portions.

The cooling tube 3 is preferably corrugated, which imparts some flexibility to it. The space between the tube 3 and the tubular elements 1 is filled with a filling material 11 procuring good thermal conduct between the tube 3 and the tubular superconductor elements; one such material is epoxy resin or polyurethane resin, for example, or preferably polyamide 6 resin (BASF LUTRAMID B4).

One embodiment of the invention is now described. This is a 1 GW three-phase transmission line 400 meters long conveying a nominal current of 28 kA at a voltage of 20 kV.

Each phase transmission line comprises the components described above, namely a superconductor, a cooling tube and an insulating tube. The information given below concerns one phase transmission line.

The phase transmission line is made up of 40 tubular portions of $Bi_2Sr_2CoCu_2O_8$ ceramic each 10 meters long and 200 mm in diameter. Under superconducting conditions the current density is 100 A/mm$^2$.

The inside diameter of the copper cooling tube is on the order of 100 mm and its thickness is approximately 4 mm. The liquid nitrogen used in normal operation is supercooled nitrogen injected at 65°K at one end of the phase transmission line and collected at the other end at 75°K. The flowrate is approximately 1.8 kg/s.

The outside diameter of the outside steel tube is in the order of 750 mm and its thickness is on the order of 5 mm; the vacuum pressure is approximately 1 Torr.

The operation of the transmission line has the following features:

During normal operation, the losses of the three-phase transmission line are on the order of 100 kW total, including the Joule effect losses due to the conductor and to the joints, and 9/50 thermal losses. The cryogenic plant compensating these losses has an electrical power consumption of about 1 MW. This represents 0.1% of the power conveyed by the transmission line. This should be compared with the corresponding ratio of 0.12% for a conventional transmission line 400 m long.

With regard to the current limiting operation, the transmission line is rated so that the current is limited to five times the nominal current In, i.e. 5 In=140 kA.

Calculations indicate that the temperature of the superconductor will increase to about 130°K, which is acceptable, and that under these conditions about 100 kg or 125 liters of nitrogen will be vaporized in each phase, i.e., almost 100 cubic meters of vapor will be produced. This represents only a small fraction of the total quantity of nitrogen contained in the tube of the transmission line, with the result that the system remains cooled to 77°K and can be returned to the service condition quickly.

There is claimed:

1. An electrical transmission line for conveying and limiting current comprising:
    a plurality of tubular portions made from a superconductive material having a high critical temperature connected end-to-end by a plurality of flexible, electrically conductive metal or alloy joints, each of said tubular portions having an axial length;
    a first tube inside said tubular portions in which a cryogenic fluid flows, said first tube having electrical contact with each said tubular portion at fewer than all points along the axial length of each tubular portion; and
    a second tube disposed around said tubular portions, and in which a vacuum is maintained.

2. An electrical transmission line according to claim 1, wherein said flexible joints comprise a ring attached to a braid.

3. An electrical transmission line according to claim 1, wherein a filling material is disposed between said tubular superconductor portions and said first tube.

4. An electrical transmission line according to claim 3, wherein said filling material is selected from polyamides, epoxy resins and polyurethane resins.

5. An electrical transmission line according to claim 1, wherein said first tube is corrugated.

6. An electrical transmission line according to claim 1, wherein said first tube is connected with the outside via tubes incorporating one-way valves.

7. An electrical transmission line according to claim 1, wherein said second tube is connected to at least one pump set.

8. An electrical transmission line according to claim 1, wherein the material of said superconductor portions is a $Bi_2Sr_2CoCu_2O_8$.

9. An electrical transmission line according to claim 1, wherein said cryogenic fluid is nitrogen at a temperature between 65 K and 77 K.

10. .An electrical transmission line according to claim 1, wherein said cryogenic fluid is a liquid.

11. An electrical transmission line according to claim 1, wherein said flexible joint includes a conductive member slidably contacting at least one of two adjacent tubular portions.

12. An electrical transmission line for conveying and limiting current comprising:
    a plurality of tubular portions made from a superconductive material having a high critical temperature connected end-to-end by a plurality of flexible, electrically conductive metal or alloy joints;
    a first tube inside said tubular portions in which a cryogenic fluid flows;
    a second tube disposed around said tubular portions in which a vacuum is maintained,
    wherein said flexible joints comprise a ring attached to a braid.

13. An electrical transmission line according to claim 12, wherein a filling material is disposed between said tubular superconductor portions and said first tube.

14. An electrical transmission line according to claim 12, wherein said filling material is selected from polyamides, epoxy resins and polyurethane resins.

15. An electrical transmission line according to claim 12, wherein said first tube is corrugated.

16. An electrical transmission line according to claim 12, wherein said first tube is connected with the outside via tubes incorporating one-way valves.

17. An electrical transmission line according to claim 12, wherein said second tube is connected to at least one pump set.

18. An electrical transmission line according to claim 12, wherein the material of said superconductor portions is $Bi_2Sr_2CoCu_2O_8$.

19. An electrical transmission line according to claim 10, wherein said cryogenic fluid is nitrogen at a temperature between 65 K and 77 K.

* * * * *